United States Patent
Han et al.

(10) Patent No.: US 9,978,845 B2
(45) Date of Patent: May 22, 2018

(54) METHOD OF OBTAINING PLANAR SEMIPOLAR GALLIUM NITRIDE SURFACES

(71) Applicant: Yale University, New Haven, CT (US)

(72) Inventors: Jung Han, Woodbridge, CT (US); Benjamin Leung, Toronto (CA)

(73) Assignee: Yale University, New Haven, CT (US)

(*) Notice: Subject to any disclaimer, the term of this patent is extended or adjusted under 35 U.S.C. 154(b) by 0 days. days.

(21) Appl. No.: 15/304,189

(22) PCT Filed: Apr. 15, 2015

(86) PCT No.: PCT/US2015/025907
§ 371 (c)(1),
(2) Date: Oct. 14, 2016

(87) PCT Pub. No.: WO2015/160909
PCT Pub. Date: Oct. 22, 2015

(65) Prior Publication Data
US 2017/0033186 A1    Feb. 2, 2017

Related U.S. Application Data
(60) Provisional application No. 61/980,304, filed on Apr. 16, 2014.

(51) Int. Cl.
*H01L 29/20*    (2006.01)
*H01L 21/02*    (2006.01)
(Continued)

(52) U.S. Cl.
CPC ...... *H01L 29/2003* (2013.01); *H01L 21/0242* (2013.01); *H01L 21/0243* (2013.01);
(Continued)

(58) Field of Classification Search
CPC ............ H01L 29/2003; H01L 21/0242; H01L 21/0243
See application file for complete search history.

(56) References Cited

U.S. PATENT DOCUMENTS

| | | |
|---|---|---|
| 4,948,456 A | 8/1990 | Schubert |
| 4,952,526 A | 8/1990 | Pribat et al. |

(Continued)

FOREIGN PATENT DOCUMENTS

| | | |
|---|---|---|
| CN | 101743618 A | 6/2010 |
| CN | 103348044 A | 10/2013 |

OTHER PUBLICATIONS

International Search Report and Written Opinion for PCT/US2015/25907 dated Aug. 12, 2015.
(Continued)

*Primary Examiner* — Errol Fernandes
(74) *Attorney, Agent, or Firm* — Wolf, Greenfield & Sacks, P.C.

(57) ABSTRACT

Methods and structures for forming flat, continuous, planar, epitaxial layers of semipolar III-nitride materials on patterned sapphire substrates are described. Semipolar GaN may be grown from inclined c-plane facets on a patterned sapphire substrate, and coalesced to form a continuous layer of semipolar III-nitride semiconductor over the sapphire substrate. Planarization of the layer is followed by crystal regrowth using a nitrogen carrier gas to produce a flat, microfabrication-grade, process surface of semipolar III-nitride semiconductor across the substrate. Quality multiple quantum wells can be fabricated in the regrown semipolar material.

26 Claims, 10 Drawing Sheets

(51) Int. Cl.
*H01L 21/306* (2006.01)
*H01L 29/15* (2006.01)
*H01L 29/04* (2006.01)

(52) U.S. Cl.
CPC ...... *H01L 21/0254* (2013.01); *H01L 21/0262* (2013.01); *H01L 21/02433* (2013.01); *H01L 21/02458* (2013.01); *H01L 21/02609* (2013.01); *H01L 21/02639* (2013.01); *H01L 21/02647* (2013.01); *H01L 21/30625* (2013.01); *H01L 29/15* (2013.01); *H01L 29/045* (2013.01); *H01L 29/155* (2013.01)

(56) References Cited

U.S. PATENT DOCUMENTS

| | | | |
|---|---|---|---|
| 5,356,510 | A | 10/1994 | Pribat et al. |
| 5,587,014 | A | 12/1996 | Iyechika et al. |
| 6,617,668 | B1 | 9/2003 | Koide et al. |
| 7,390,750 | B1 | 6/2008 | Ramkumar et al. |
| 7,727,874 | B2 | 6/2010 | Hanser et al. |
| 8,252,684 | B1 | 8/2012 | Lee et al. |
| 8,482,103 | B2 | 7/2013 | Liu et al. |
| 8,698,173 | B2 | 4/2014 | Goswami |
| 2002/0179911 | A1 | 12/2002 | Linthicum et al. |
| 2002/0189534 | A1 | 12/2002 | Tang et al. |
| 2003/0211713 | A1 | 11/2003 | Suguro et al. |
| 2004/0175844 | A1 | 9/2004 | Yang et al. |
| 2004/0261692 | A1 | 12/2004 | Dwilinksi et al. |
| 2005/0184307 | A1 | 8/2005 | Li et al. |
| 2006/0131606 | A1 | 6/2006 | Cheng |
| 2006/0292719 | A1 | 12/2006 | Lochtefeld et al. |
| 2007/0017439 | A1 | 1/2007 | Xianyu et al. |
| 2007/0080369 | A1 | 4/2007 | Sakai |
| 2008/0042543 | A1 | 2/2008 | Conrad |
| 2008/0093622 | A1 | 4/2008 | Li et al. |
| 2009/0001416 | A1 | 1/2009 | Chua et al. |
| 2009/0032799 | A1 | 2/2009 | Pan |
| 2009/0098343 | A1 | 4/2009 | Arena et al. |
| 2010/0012948 | A1 | 1/2010 | Usikov et al. |
| 2010/0102307 | A1 | 4/2010 | Chua et al. |
| 2010/0117188 | A1 | 5/2010 | Waldrab et al. |
| 2010/0171176 | A1 | 7/2010 | Wells |
| 2010/0187568 | A1 | 7/2010 | Arena |
| 2010/0210067 | A1 | 8/2010 | Butcher et al. |
| 2011/0045658 | A1 | 2/2011 | Liu et al. |
| 2011/0065264 | A1 | 3/2011 | Moffatt et al. |
| 2011/0227198 | A1* | 9/2011 | Wunderer ............ C30B 23/025 257/615 |
| 2011/0244663 | A1 | 10/2011 | Su |
| 2011/0254134 | A1 | 10/2011 | Detchprohm et al. |
| 2011/0292957 | A1 | 12/2011 | Bhat et al. |
| 2012/0025195 | A1 | 2/2012 | McComber et al. |
| 2012/0043528 | A1 | 2/2012 | Lo et al. |
| 2012/0098102 | A1 | 4/2012 | Imer et al. |
| 2012/0104558 | A1 | 5/2012 | Ishibashi |
| 2012/0112603 | A1 | 5/2012 | Masaki |
| 2012/0115293 | A1 | 5/2012 | Noh et al. |
| 2013/0001682 | A1 | 1/2013 | Tang et al. |
| 2013/0015492 | A1 | 1/2013 | Hashimoto et al. |
| 2013/0294782 | A1 | 11/2013 | Liboiron-Ladouceur et al. |
| 2013/0313567 | A1 | 11/2013 | Furuya et al. |

OTHER PUBLICATIONS

International Preliminary Report on Patentability for PCT/US2015/25907 dated Oct. 27, 2016.
Honda et al., Growth of GaN free from cracks on a (111) Si substrate by selective metalorganic vapor-phase epitaxy. Appl Phys Lett. Jan. 14, 2002;80(2):222-4.
Kawaguchi et al., Influence of polarity on carrier transport in semipolar (2021) and (2021) multiple-quantum-well light-emitting diodes. Appl Phys Lett. 2012;100:231110.1-4.
Piprek, Efficiency droop in nitride-based light-emitting diodes. Physica Status Solidi (a). Oct. 2010;207(10):2217-25.
Pribat et al., Conformal vapor phase epitaxy. Appl Phys Lett. 1989;55(24):2544-6. doi: 10.1063/1.101976.
Pribat et al., Defect-free, conformally grown (100) GaAs films. Appl Phys Lett. Jul. 1990;57(4):375-7. doi: 10.1063/1.103696.
Shubert et al., Confined Lateral Selective Epitaxial Growth of Silicon for Device Fabrication. IEEE Electron Device Letters. May 1990;11(5):181-3.
Honda et al., Growth of (11 01) GaN on a 7-degree off-oriented (0 0 1)Si substrate by selective MOVPE. J of Crystal Growth. Apr. 15, 2002;82-86.
Kung et al., Polycrystalline Si thin-film transistors fabricated at ≤ 800° C.: Effects of grain size and {110} fiber texture. J. Appl. Phys. 62(4), Aug. 15, 1987; pp. 1503-1509.
U.S. Appl. No. 15/304,135, filed Oct. 14, 2016, Han et al.
U.S. Appl. No. 14/776,634. filed Sep. 14, 2015, Han et al.
U.S. Appl. No. 14/379,088, filed Aug. 15, 2014, Han.
PCT/US2015/25907, dated Aug. 12, 2015, International Search Report and Written Opinion.
PCT/US2015/25907, dated Oct. 27, 2016, International Preliminary Report on Patentability.

\* cited by examiner

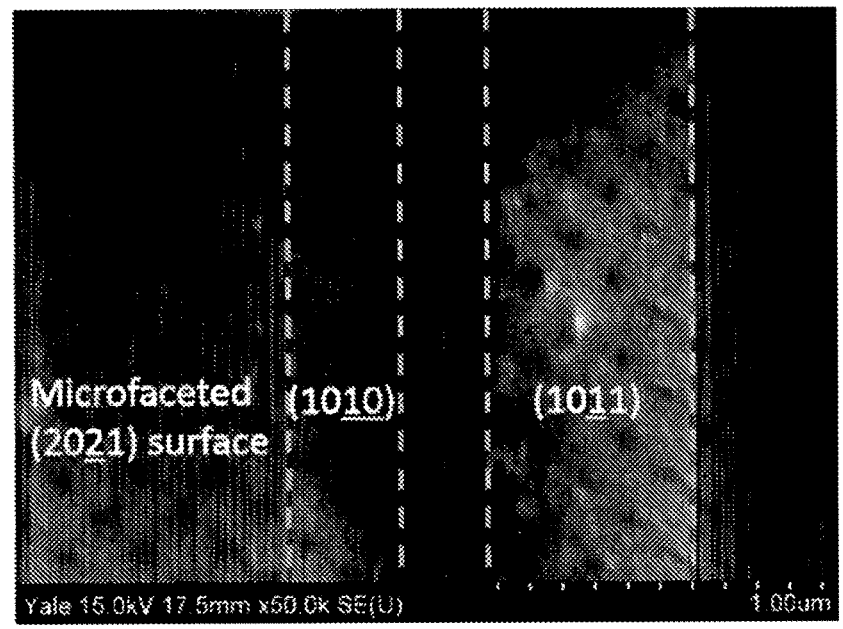
*FIG. 4A*
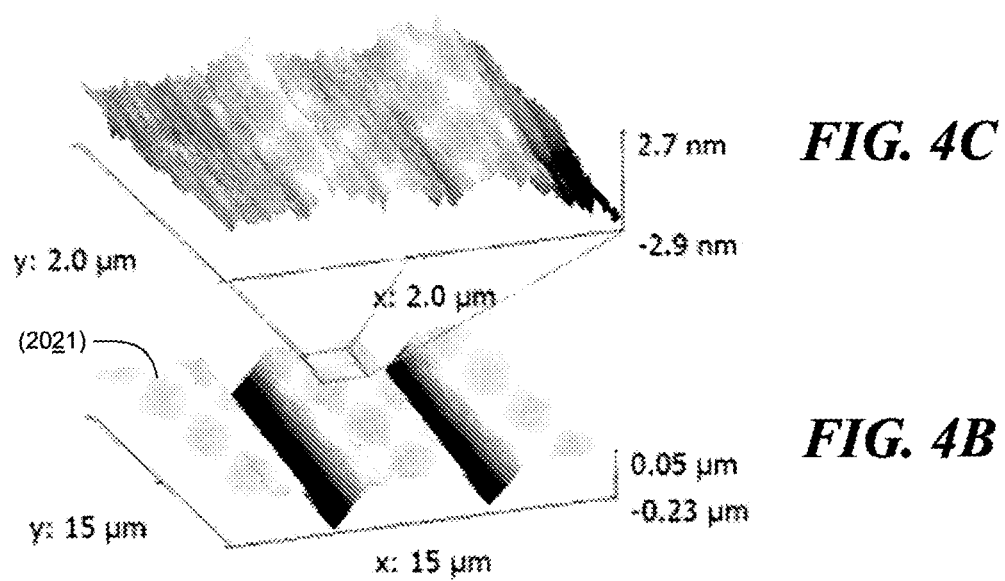
*FIG. 4C*
*FIG. 4B*

US 9,978,845 B2

METHOD OF OBTAINING PLANAR SEMIPOLAR GALLIUM NITRIDE SURFACES

CROSS-REFERENCE TO RELATED APPLICATIONS

This application is the national phase of International Application No. PCT/US2015/025907, titled "METHOD OF OBTAINING PLANAR SEMIPOLAR GALLIUM NITRIDE SURFACES", filed on Apr. 15, 2015, which claims the benefit of U.S. provisional Application Ser. No. 61/980,304, titled "Method of Obtaining Planar Semipolar Gallium Nitride Surfaces," filed on Apr. 16, 2014, which applications are hereby incorporated by reference to the maximum extent allowable by law.

BACKGROUND

Technical Field

The technology relates to methods and structures for forming planar, single-facet semipolar III-nitride layers and devices on patterned sapphire substrates.

Discussion of the Related Art

Gallium nitride (GaN) and other III-nitride materials are widely recognized as desirable materials for fabrication of integrated devices. These materials typically have wider band gaps than silicon-based semiconductors and can be used to make electro-optical devices (e.g., LEDs and diode lasers) that emit radiation in the green and blue regions of the visible spectrum. Also, because of their wide band-gap, III-nitride materials can exhibit higher breakdown voltages when used for fabricating integrated transistors. Accordingly, III-nitride materials may be desirable for optoelctronics and high-power electronics applications.

Like silicon, III-nitride materials may be grown as high-purity, crystalline material. Unlike silicon, III-nitride materials are typically more difficult and expensive to grow than silicon, so that bulk substrates of III-nitride materials larger than a few inches in diameter are not currently as commercially feasible as bulk silicon substrates. As a result, researchers have developed, and continue to develop, methods for epitaxially growing integrated-circuit-grade III-nitride layers on silicon or other crystalline substrates. Once grown, integrated devices may be fabricated in the III-nitride epitaxial layers using planar microfabrication techniques.

SUMMARY

Methods and structures associated with forming planar semipolar gallium nitride (GaN) layers and other semipolar III-nitride layers on patterned sapphire substrates (PSS) is described. A sapphire substrate may be patterned with a surface-grating structure to expose c-plane or inclined c-plane surfaces, and semipolar III-nitride semiconductor may be grown from these crystal-growth surfaces. A masking process may be carried out prior to semiconductor growth to prevent nucleation and growth at other surfaces of the patterned sapphire substrate. Growth of the semipolar material may be continued, so that the material coalesces and forms a continuous III-nitride layer over the patterned sapphire substrate. The semiconductor layer may be planarized and III-nitride material regrown over the planarized layer. During regrowth, a nitrogen carrier gas, instead of a hydrogen carrier gas, may be used to provide a flat, semipolar, atomically-smooth process surface on which integrated devices may be fabricated.

According to some embodiments, a planar semipolar III-nitride substrate comprises a patterned sapphire substrate having a plurality of surfaces at different orientations and a masking layer formed over some of the surfaces, crystal-growth surfaces that are a portion of the plurality of surfaces and that are not covered by the masking layer, and a planar semipolar gallium-nitride epitaxial layer formed over the patterned sapphire substrate.

In some aspects, the patterned sapphire substrate has a (22$\underline{4}$3) facet approximately parallel to a process surface of the substrate and a c-plane facet approximately parallel to the crystal-growth surfaces. In some cases, the patterned sapphire substrate comprises an array of trenches with the crystal-growth surfaces forming inclined walls of the trenches. A spacing of the trenches may be between approximately 0.25 microns and approximately 10 microns, and a depth of the trenches may be between approximately 50 nanometers and approximately 2 microns.

According to some implementations, the epitaxial gallium-nitride coalesces above the trenches to form a continuous and planar semiconductor layer across the substrate. A roughness of a surface of the planer semiconductor layer measured over a 15 µm×15 µm area may be less than 5 nm root-mean-square in some cases, and less than 3 nm RMS in some instances. In some aspects, the planar semipolar gallium-nitride epitaxial layer has a single and continuous planar surface across the substrate that is approximately parallel to a (20$\underline{2}$1) facet of the semipolar gallium-nitride.

According to some aspects, a planar semipolar III-nitride substrate may comprise a buffer layer between the crystal-growth surfaces and the epitaxial gallium-nitride. The buffer layer may comprise aluminum-nitride, and may have a thickness between approximately 10 nm and approximately 50 nm.

The foregoing aspects, implementations, and features may be included in any suitable combination in an embodiment of a substrate having a semipolar gallium-nitride epitaxial layer formed on patterned sapphire, and may be included in any suitable combination in one or more of the following method embodiments for making a substrate having a semipolar gallium-nitride epitaxial layer formed on patterned sapphire.

According to some embodiments, a method for forming planar semipolar III-nitride epitaxial layers comprises growing semipolar gallium-nitride adjacent crystal-growth surfaces of a patterned sapphire substrate, planarizing the grown semipolar gallium-nitride, and regrowing the semipolar gallium-nitride using a nitrogen carrier gas.

In some aspects, regrowing the semipolar gallium-nitride comprises regrowth conditions that do not include a hydrogen carrier gas. In some implementations, the nitrogen carrier gas is $N_2$. Regrowing the semipolar gallium-nitride may comprise growing the semipolar gallium-nitride using metal-organic chemical vapor deposition. In some aspects, planarizing the grown semipolar gallium-nitride comprises planarization by chemical-mechanical polishing.

According to some implementations, a temperature during regrowth is between approximately 980° C. and approximately 1070° C. In some implementations, a pressure during regrowth is between approximately 100 mbar and approximately 300 mbar. In some cases, a flow rate of $NH_3$ gas during regrowth is between approximately 0.5 slm and approximately 4 slm. In some cases, a flow rate of trimethylgallium or triethylgallium during regrowth is between approximately 30 sccm and approximately 50 sccm. According to some implementations, a growth rate during regrowth is between 1 µm/hr and approximately 2 µm/hr. In some aspects, growing semipolar gallium-nitride and regrowing semipolar gallium-nitride comprise growing the gallium-nitride with a (20$\underline{2}$1) facet approximately parallel to a process surface of the substrate.

According to some implementations, a method for forming planar semipolar III-nitride epitaxial layers may further comprise forming a low-temperature aluminum-nitride or a low-temperature gallium-nitride buffer layer at the crystal-growth surfaces. Either of the low-temperature buffer layers may be formed below a temperature of approximately 600° C.

A method for forming planar semipolar III-nitride epitaxial layers may further comprise, prior to growing semipolar gallium-nitride, forming a masking layer to cover surfaces of the patterned sapphire substrate. In some aspects, forming the masking layer comprises depositing a material conformally by a vapor deposition process. A method may further comprise removing the conformally deposited material from the crystal-growth surfaces.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. Where the drawings relate to microfabrication, only one device and/or portion of a substrate may be shown to simplify the drawings. In practice, a large plurality of devices or structures may be fabricated in parallel across a large area of a substrate or entire substrate. The drawings are not intended to limit the scope of the present teachings in any way.

FIG. 4A is a scanning-electron microscope (SEM) image showing, in plan view, regrowth of semipolar GaN using a hydrogen carrier gas during regrowth, according to some embodiments;

FIG. 4B is an atomic-force microscope (AFM) image showing multifaceted topography of regrown semipolar GaN, according to some embodiments;

FIG. 4C is an AFM image showing microfacets formed on a regrown surface of (20$\underline{2}$1) GaN;

Figure 1:
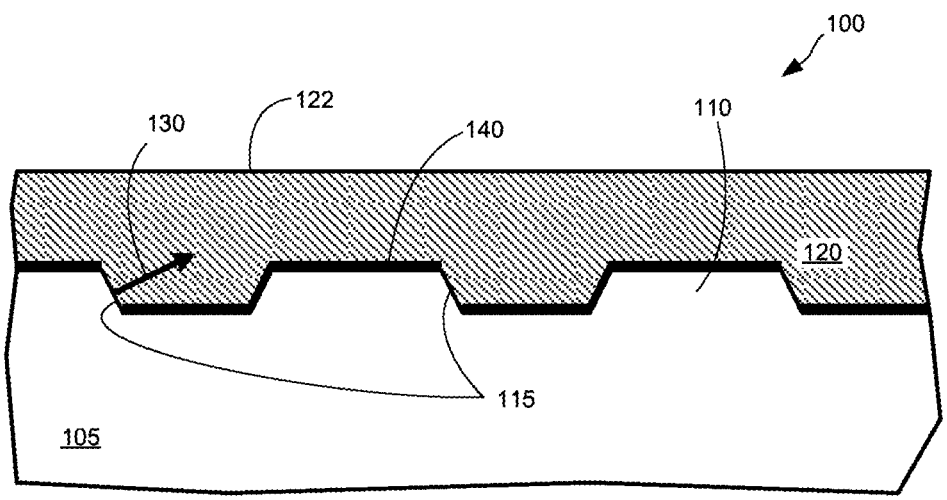
FIG. 1 is an elevation view depicting a portion of a substrate comprising III-nitride material epitaxially grown on a patterned sapphire substrate, according to some embodiments.

When referring to the drawings in the following detailed description, spatial references "top," "bottom," "upper," "lower," "vertical," "horizontal," and the like may be used. For example, "vertical" may be used to refer to a direction normal to the substrate surface, and "horizontal" may be used to refer to a direction parallel to the substrate surface when referring to the drawings. "Upper," "top," or "above" may be used to refer to a vertical direction away from the substrate, whereas "lower," "bottom," or "below" may be used to refer to a vertical direction toward the substrate. Such references are used for teaching purposes, and are not intended as absolute references for embodied devices. An embodied device may be oriented spatially in any suitable manner that may be different from the orientations shown in the drawings.

The features and advantages of the embodiments will become more apparent from the detailed description set forth below when taken in conjunction with the drawings.

DETAILED DESCRIPTION

Because of their wide band-gap values, III-nitride materials, such as GaN, are desirable materials for fabricating green-wavelength or blue-wavelength light-emitting devices and for making high-power or high-voltage transistors. The inventors have recognized and appreciated that some crystal orientations of III-nitride materials may provide improved device performance over other crystal orientations. For example, the semipolar (20$\bar{2}$1) orientation has recently appeared to be a leading candidate for high efficiency and long wavelength LEDs and laser diodes (LDs), ever since the initial demonstration of a green LD in 2009. Semipolar gallium nitride materials may be beneficial for high-efficiency light-emitting diodes compared to polar or non-polar orientations, and have the possibility to offer a solution to efficiency droop and to achieve high-efficiency, long-wavelength emission in light-emitting diodes. With the reduction or absence of polarization fields, the active region volume of a device may be increased without a deterioration of efficiency by the quantum confined Stark effect. This may allow a reduction of the carrier densities causing the efficiency droop.

Although polar orientations of GaN (both gallium polar and nitrogen polar) have been formed on planar sapphire substrates, microfabrication-grade, planar semipolar GaN has not been successfully formed on sapphire substrates. The inventors have recognized and appreciated that a patterned sapphire substrate (PSS) may provide a suitable template on which to form semipolar GaN, and have conceived and developed structures and processes for forming single-crystalline, planar, semipolar III-nitride materials (such as GaN) on patterned sapphire substrates.

An example of a substrate suitable for use in integrated circuit fabrication is depicted in FIG. 1. A substrate 100 may comprise a patterned sapphire substrate 105 having an array of surface structures 110 (e.g., trenches and stripes) patterned across a surface of the sapphire substrate. The surface structures 110 may comprise a plurality of approximately planar surfaces, at least some of which are covered by masking material 140 that prevents crystal growth from the sapphire. Some of the surfaces may be slightly curved, in some embodiments. The surfaces may be oriented in different directions. Some of the surfaces may not be covered by the masking material, and comprise crystal-growth surfaces 115. The crystal-growth surfaces may be approximately parallel (e.g., within 10 mrad) to a c-plane facet 130 of the sapphire according to some embodiments, having an orientation depicted by the arrow. III-nitride semiconductor 120 may be grown from the crystal-growth surfaces 115 at distinct locations, and the growth may continue until the semiconductor 120 coalesces above the patterned features on the sapphire substrate and forms a continuous epitaxial layer, as depicted in the drawing. In some embodiments, there may be at least one thin buffer layer (not shown) formed between the crystal-growth surfaces 115 and the semiconductor 120. The III-nitride semiconductor may extend partially or entirely across the sapphire substrate and form a planar "process surface" 122 on the substrate. Integrated devices may be fabricated on the process surface 122.

Figure 2A:
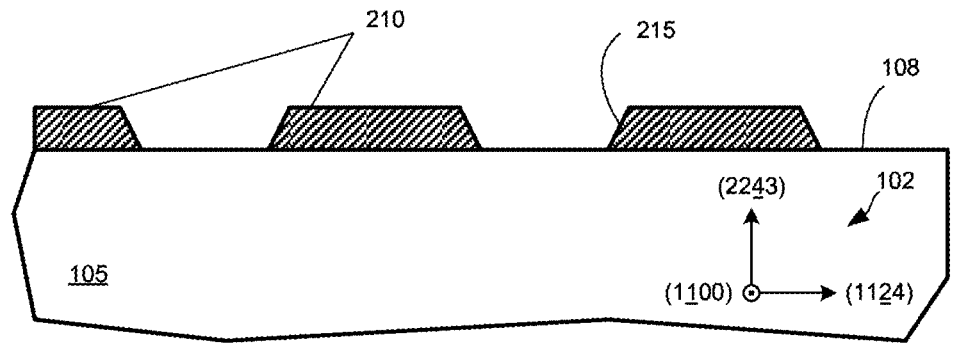
FIGS. 2A-2B depict structures associated with a process for patterning a sapphire substrate, according to some embodiments.
Figure 2B:
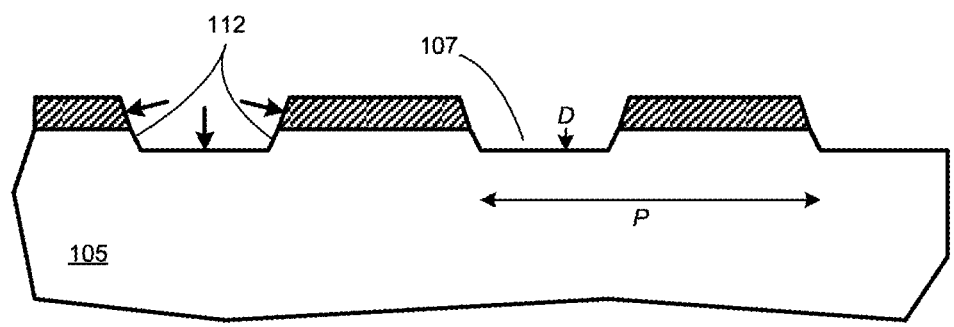

FIGS. 2A-2B depict structures associated with a method for forming a patterned sapphire substrate, according to some embodiments. An initially unetched sapphire substrate 105 may be cut so that its (22$\bar{4}$3) plane is approximately parallel to a top surface 108 of the substrate. A resist 210 may be deposited and patterned on the surface of the sapphire substrate 105. According to some implementations, the resist may be patterned via photolithograpy or interferometric lithography, though any suitable patterning process may be used. The resist may be patterned as a periodic grating, according to some embodiments, so that bars of resist 210 extend along the surface of the substrate. The resist pattern may be aligned to a crystallographic orientation of the sapphire substrate, so that the bars of resist 210 run in a direction that is approximately normal to the (1$\bar{1}$00) plane of the sapphire substrate 105. The resist 210 may be a soft resist (e.g., a polymeric resist) according to some embodiments, or may be a hard resist (e.g., patterned inorganic material) in some implementations. In some cases, the resist may be patterned to have sloping side walls 215, as depicted in the drawing.

A dry etching process (e.g., a reactive ion etching (RIE) process) may be used to etch the sapphire substrate 105, as depicted in FIG. 2B. The etching process may be anisotropic or semi-anisotropic. According to some embodiments, the etching process may be semi-selective, in that it etches some of the resist 210, while primarily etching the substrate 105. In a semi-selective etch, as the etching of the sapphire substrate 105 proceeds, the resist 210 may etch back in addition to trenches 107 being etched into the substrate. In some embodiments, a chlorine-based etchant may be used for etching the sapphire. In some implementations, a small amount of an etchant for the resist (e.g., $O_2$ for a polymeric resist) may be included as an etchant gas to etch back some of the resist 210. Other etchants may be used depending on the material used for the resist. In some implementations, an etchant for the sapphire substrate may partially etch a resist 210.

The result of partially etching back the resist while the trenches are being etched may create sloped sidewalls 112 along the trenches in the sapphire substrate 105, as illustrated in FIG. 2B. Instead of the sidewalls being orientated 90° with respect to the unetched surface of the sapphire substrate 105, the sidewalls may be oriented between approximately 60° and approximately 80°. In some cases, the sidewalls may be oriented between 60° and 80°. In some embodiments, the sidewalls may be oriented between approximately 65° and approximately 75°. In some cases, the sidewalls may be oriented between 65° and 75°. According to some embodiments, the orientation of the sapphire substrate is chosen such that the (0001) sapphire c-plane is oriented with respect to the sapphire substrate surface to approximately align with the (0001) GaN plane when the (20$\bar{2}$1) GaN plane is parallel to the substrate surface. Since the angle between (0001) GaN and (20$\bar{2}$1) is 75.09°, and considering the 30° in-plane rotation of the c-GaN epitaxial relation on c-sapphire ([11$\bar{2}$0] GaN//[10$\bar{1}$0] sapphire), a sapphire orientation of c-plane offcut approximately 75.09° toward the a-direction may be used, (i.e., sapphire (22$\bar{4}$3) offcut approximately 0.45°). In some implementations, the slope of the etched sapphire sidewalls 112 may be controlled by adjusting the etch rate of the resist 210 (e.g., adjusting a concentration of etchant for the resist) and/or adjusting the slope of the sidewalls 215 of the resist 210 (e.g., adjusting exposure and development conditions for patterning the resist). According to some embodiments, a spacing or pitch P of the trenches 107 etched into the sapphire may be between approximately 0.25 micrometers (μm) and approximately 10 μm. In some cases, the pitch P may be between 0.25 μm and 10 μm. In some embodiments, the spacing between trenches may not be periodic. According to some embodiments, an etch depth D of the trenches may be between approximately 50 nanometers (nm) and approximately 2 μm. In some cases, the etch depth D may be between 50 nm and 2 μm. The width of the trenches may be approximately equal to, or equal to, one-half the pitch P, in some embodiments. In other embodiments, the width of the trenches may be greater than, or less than, one-half the pitch P. After etching the trenches 107, any remaining resist may be removed from the substrate 105 using a dry etch, a solvent, or a substrate cleaning process that dissolves the resist 210.

After removing the resist, a masking layer 140 may be formed over some of the patterned surfaces on the sapphire substrate. The inventors have found that a masking layer 140 comprising an evaporated oxide (e.g., silicon oxide deposited by an electron-beam evaporation process) may result in irreproducible crystal-growth results under subsequent high-temperature (HT) III-nitride growth conditions. These results are believed to be attributed to less-than unity sticking coefficient, surface diffusion, and re-evaporation of the e-beam evaporated silicon oxide. To overcome problems associated with an evaporated oxide masking layer, the inventors have conceived and developed a process for forming a high-temperature conformal coating to mask selected surfaces of the sapphire substrate.

Figure 2C:
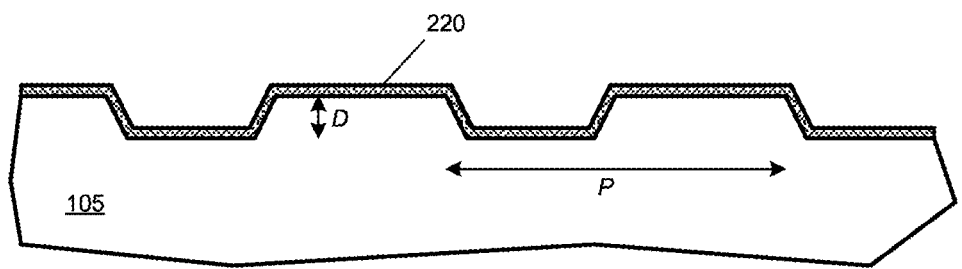
FIGS. 2C-2F depict structures associated with a process for masking selected surfaces of a patterned sapphire substrate, according to some embodiments.

According to some embodiments, a high-temperature conformal coating 220 may be formed over the surface of the patterned sapphire substrate 105, as depicted in FIG. 2C. The HT conformal coating may comprise an oxide (e.g., a silicon oxide) or a nitride (e.g., a silicon nitride) that may be formed by a HT conformal deposition process, according to some embodiments. For example, an oxide may be deposited by a chemical vapor deposition (CVD) process, such as plasma-enhanced chemical vapor deposition (PECVD). In some implementations, an oxide or nitride coating 220 may be deposited by an atomic layer deposition (ALD) process. The thickness of the conformal coating may be between approximately 10 nm and approximately 50 nm according to some embodiments, and may cover all patterned surfaces of the substrate 105, as depicted in the drawing. In some cases, the thickness of the conformal coating may be between 10 nm and 50 nm.

Figure 2D:
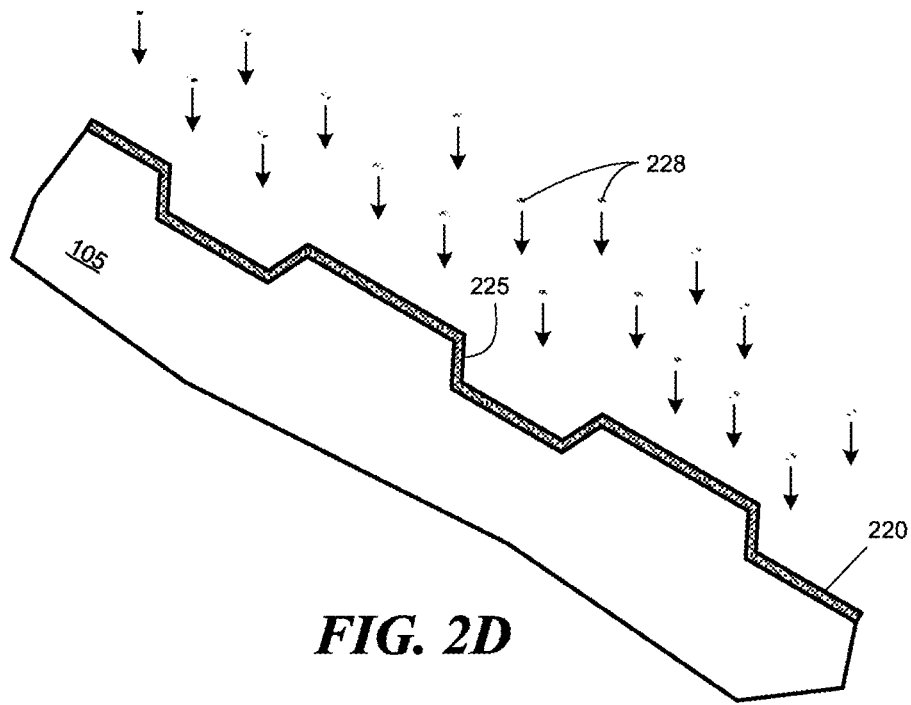
Figure 2E:
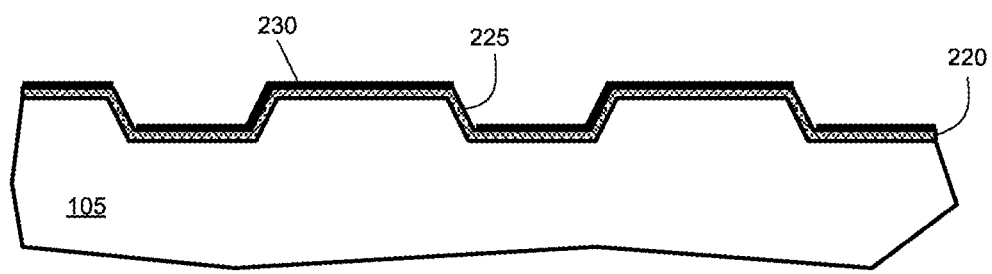

According to some embodiments, a shadow evaporation may be performed to form a resist 230 over a portion of the oxide coating 220, as depicted in FIGS. 2D-2E. For example, the substrate 105 may be inclined at an angle with respect to a target in an electron-beam evaporation system. During the evaporation, evaporants 228 may be incident on exposed surfaces of the oxide coating 220. Some "shadowed surfaces" 225 of the coating 220 may be hidden or screened from the incident evaporants 228 by an overlying surface or material. These shadowed surfaces 225 may not be coated by the evaporants 228. In some embodiments the evaporants comprise metal (e.g., any one or combination of Cr, Ni, Al, Ti, Au, Ag), though other materials may be used in some embodiments. The shadow evaporation may form a resist 230 over selected surfaces of the coating 220, but leave the shadowed surfaces exposed.

In some embodiments, photolithography may be used to form a resist over selected surfaces of the conformal coating 220. However, photolithography may require several process steps (e.g., resist deposition, exposure, and developing), and require an alignment of a photomask to the patterned substrate features.

Figure 2F:
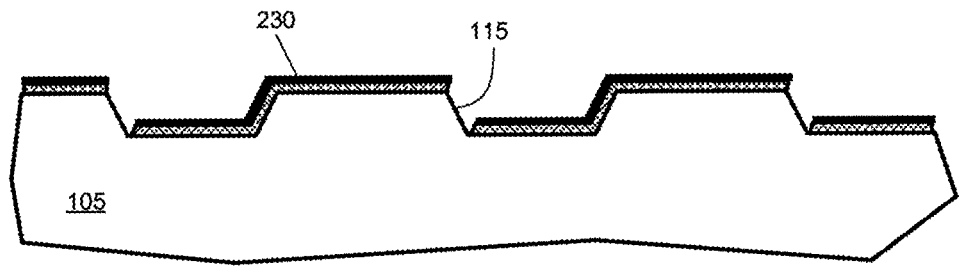

A shadow evaporation may be used to form a hard resist 230 over selected surfaces of a coating 220 in one step without the need for alignment of a mask to the substrate, resulting in a structure as depicted in FIG. 2E. The shadowed surfaces 225, screened from the evaporant, may have an exposed oxide layer 220 covering the c-plane surfaces of the patterned sapphire substrate, and not include an overlayer of metal or other protective resist 230. A selective anisotropic dry etch may then be performed to remove the oxide coating 220 from the shadowed surfaces 225 and expose the underlying sapphire. The dry etch may comprise a fluorine-based etchant for etching an oxide coating 220, according to some embodiments. The etching may expose the underlying crystal-growth surfaces 115 of the patterned sapphire substrate, as depicted in FIG. 2F. In some embodiments, a wet etch (e.g., a buffered oxide etch) may be used to remove an oxide coating 220 from the shadowed surfaces 225. In some implementations, a wet or dry etch may not be selective, and may be a timed etch. An etch that removes the coating 220 may, in some cases, partially etch the sapphire after removing the coating.

According to some embodiments, the resist 230 may be removed with a dry or wet etch process or a substrate-cleaning process. For example, a hard coating of metal (e.g., Cr) may be removed with a suitable metal etchant. In some implementations, the substrate may be cleaned in preparation for epitaxial growth of III-nitride material. For example, the substrate may be cleaned in acetone, methanol, and a piranha solution before loading into a metal-organic chemical vapor deposition reactor for subsequent crystal growth.

The inventors have discovered and appreciated that careful preparation of a buffer layer at the exposed crystal-growth surfaces 115 of the patterned sapphire substrate 105 is needed to form integrated-circuit-grade semipolar GaN. According to some embodiments, a patterned sapphire substrate 105 may be subjected to a cleaning process followed by a low-temperature GaN or low-temperature AN buffer layer growth process. A low-temperature buffer layer may be formed at temperatures below approximately 600° C., according to some embodiments. In some cases, the low-temperature buffer layer may be formed at temperatures below 600° C. The cleaning process and buffer layer growth may be carried out in a same growth reactor. The cleaning process may comprise heating the substrate to between approximately 1000° C. and approximately 1200° C. in a hydrogen ($H_2$) ambient. In some cases, the cleaning process may be executed at a temperature between 1000° C. and 1200° C. in a hydrogen (H2) ambient.

According to some embodiments, a low-temperature (LT) AN buffer layer may be formed on the substrate. Although the LT AN buffer layer may not selectively grow at the crystal-growth surfaces 115 (e.g., it may form on all surfaces), subsequent III-nitride growth may favor nucleation and growth off the c-plane oriented AN formed on the c-plane sapphire crystal-growth surfaces 115. In some implementations, an AN buffer layer may be grown at a temperature between approximately 450° C. and approximately 600° C. In some cases, the buffer layer may be formed under AN epitaxial growth conditions at temperatures between 450° C. and 600° C. According to some embodiments, the LT AN buffer layer is formed at a temperature of approximately 500° C. In some instances, the LT AN buffer layer is formed at a temperature of 500° C. In some cases, the chamber pressure may be maintained between approximately 100 mbar and approximately 250 mbar. In some instances, the chamber pressure may be maintained between 100 mbar and 250 mbar. A flow rate of $NH_3$ may be between approximately 1 slm and approximately 4 slm, and a flow rate of trimethylaluminum (TMA) may be between approximately 30 sccm and approximately 50 sccm. In some cases, a flow rate of $NH_3$ may be between 1 slm and 4 slm, and a flow rate of trimethylgallium (TMGa) may be between 30 sccm and 50 sccm. The buffer layer may be grown to a thickness between approximately 10 nm and approximately 40 nm, according to some embodiments. In some cases, the buffer layer may be grown to a thickness between 10 nm and 40 nm. In some cases, a LT AN buffer layer is formed using a deposition rate between approximately 0.1 nm/sec and approximately 0.2 nm/sec, and a thickness of the buffer layer may be approximately 20 nm. In some instances, the LT AN buffer layer is formed using a deposition rate between 0.1 nm/sec and 0.2 nm/sec. The phrases "at temperatures" and "at a temperature" may be used to refer to one or more temperatures within a range of temperatures.

According to other embodiments, a LT GaN buffer layer may be formed on the substrate. A GaN buffer layer may be formed under epitaxial growth conditions at temperatures between approximately 450° C. and approximately 600° C. In some cases, the GaN buffer layer may be formed at a temperature between 450° C. and 600° C. According to some embodiments, the LT GaN buffer layer is formed at a temperature of approximately 500° C. In some cases, the chamber pressure may be maintained between approximately 100 mbar and approximately 250 mbar. In some instances, the chamber pressure may be maintained between 100 mbar and 250 mbar. A flow rate of $NH_3$ may be between approximately 1 slm and approximately 4 slm, and a flow rate of trimethylgallium (TMGa) may be between approximately 30 sccm and approximately 50 sccm. In some cases, the flow rate of $NH_3$ may be between 1 slm and 4 slm, and a flow rate of trimethylgallium (TMGa) may be between 30 sccm and 50 sccm. The buffer layer may be grown to a thickness between approximately 10 nm and approximately 40 nm, according to some embodiments. In some cases, the buffer layer may be grown to a thickness between 10 nm and 40 nm.

According to some embodiments, a buffer layer may be formed from a material different than a subsequently-grown material. For example, a buffer layer may be formed from any suitable III-nitride alloy (e.g., AN, InN, AlGaN, InGaN, InAlGaN), whereas a subsequently-grown epitaxial layer may comprise GaN. In some implementations, a buffer layer may be formed from GaN, and a subsequently-grown semipolar epitaxial layer may comprise any other suitable III-nitride alloy. The formation of other semipolar materials may require the addition or substitution of other reactants, such as trimethylaluminum (TMA) or triethylaluminum (TEA) as sources of aluminum and trimethylindium (TMI) or triethylindium (TEI) as sources of indium. The flow rates for these gases may be between approximately 10 sccm and approximately 60 sccm during growth or regrowth of a semipolar III-nitride epilayer. In some cases, the flow rates for these gases may be between 10 sccm and 60 sccm during growth or regrowth of a semipolar III-nitride epilayer.

After forming a buffer layer, temperature in the reaction chamber may be ramped up to a higher temperature to anneal the buffer layer for a period of time before initiating growth of semipolar GaN. In some embodiments, the temperature may be ramped to a value between approximately 1000° C. and approximately 1100° C. The anneal time may be between approximately 1 minute and approximately 10 minutes. In some cases, the temperature may be ramped to a value between 1000° C. and 1100° C., and the anneal time may be between approximately 1 minute and approximately 10 minutes.

Epitaxial growth of semipolar GaN may then proceed. An epitaxial growth process may comprise metal-organic chemical-vapor deposition (MOCVD), according to some embodiments. In some embodiments molecular-beam epitaxy (MBE) or vapor phase epitaxy (VPE) processes may be used. In some implementations, atomic layer deposition may be used. In some implementations, growth of semipolar GaN may be carried out at a temperature between approximately 1000° C. and approximately 1100° C. In some instances, the semipolar GaN may be grown at a temperature between 1000° C. and 1100° C. In some cases, growth of the GaN may be carried out at a temperature of approximately 1030° C. In some cases, the chamber pressure may be maintained between approximately 100 mbar and approximately 250 mbar during growth of semipolar GaN. In some instances, the chamber pressure may be maintained between 100 mbar and 250 mbar during growth of semipolar GaN. A flow rate of $NH_3$ may be between approximately 1 slm and approximately 4 slm, and a flow rate of trimethylgallium (TMGa) may be between approximately 30 sccm and approximately 50 sccm. In some cases, the flow rate of $NH_3$ may be between 1 slm and 4 slm, and a flow rate of trimethylgallium (TMGa) may be between 30 sccm and 50 sccm.

Figure 2G:
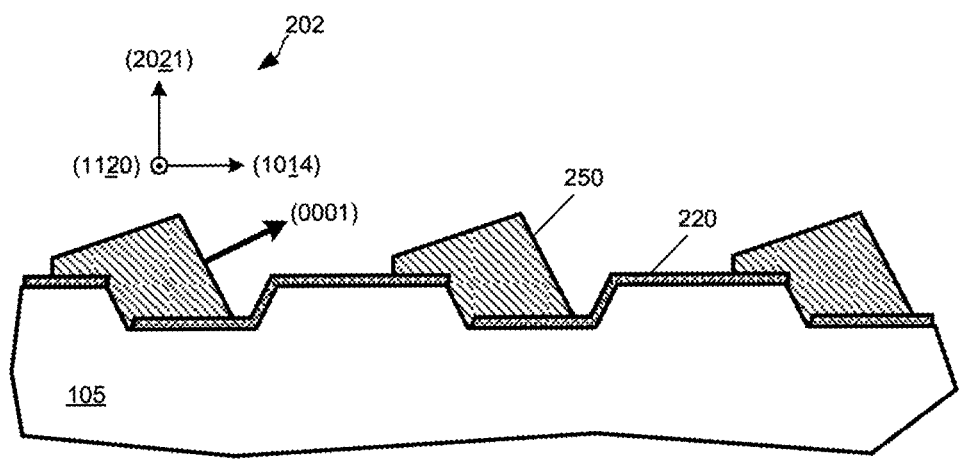
FIG. 2G depicts formation of semipolar GaN on a patterned sapphire substrate, according to some embodiments.

As growth of semipolar GaN material proceeds from the crystal-growth surfaces 115, islands of III-nitride crystals 250 may first form across the surface of the patterned sapphire substrate 105, as depicted in FIG. 2G. Because of the inclined crystal growth surfaces 115 on the patterned sapphire substrate 105, the gallium-nitride crystals 250 may grow with a (20$\bar{2}$1) crystallographic plane approximately parallel to the original planar surface of the sapphire substrate 105. Crystallographic orientations for semi-gallium-polar GaN crystals 250 are depicted by the axes 202 in FIG. 2G.

Figure 2H:
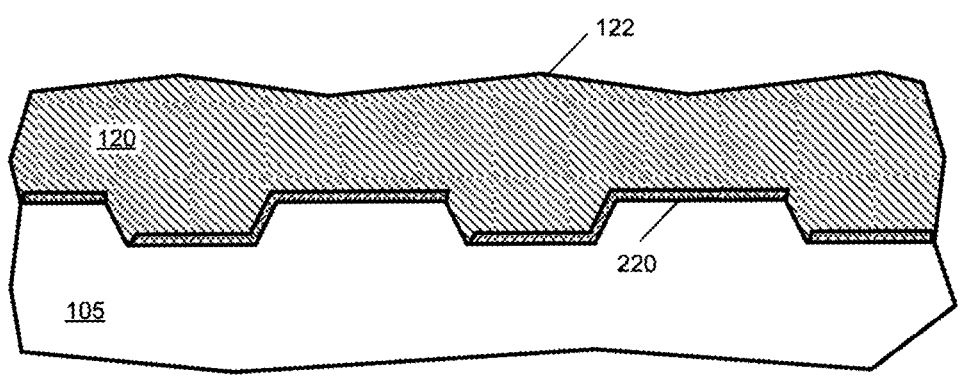
FIG. 2H depicts formation of coalesced semipolar GaN on a patterned sapphire substrate, according to some embodiments.

Epitaxial growth may be continued so that the III-nitride crystals 250 coalesce to form a continuous semiconductor layer 120 across a region of the substrate 105 or entire substrate, as depicted in FIG. 2H. A thickness of the epitaxial layer may be between approximately one micron and approximately 10 microns, according to some embodiments. In some cases, a thickness of the epitaxial layer may be between one micron and 10 microns. If the sapphire substrate has a smaller periodicity (e.g., less than one micron), a thickness of the epitaxial layer may be less than one micron in some cases. In some implementations, a process surface 122 of the semiconductor 120 may be corrugated and have ridges running parallel to the crystal growth surfaces 115, which may result from intersections of preferred crystallographic growth planes (e.g., the (10$\bar{1}$0) and (10$\bar{1}$1) planes for semi-gallium-polar GaN).

In some embodiments, epitaxial growth may be continued to reduce a number of defects at a process surface of the coalesced semiconductor 120. According to some embodiments, a base epitaxial layer 120 of semipolar GaN may be grown to a thickness for which a density of defects reduces to levels at the process surface that are acceptable for integrated-circuit devices. For example, a density of defects at a top surface of the epitaxial layer 120 may be less than about $10^9$ defects $cm^{-2}$ in some embodiments, less than about $10^6$ defects $cm^{-2}$ in some embodiments, less than about $10^4$ defects $cm^{-2}$ in some embodiments, less than about $10^2$ defects $cm^{-2}$ in some embodiments, and yet less than about 10 defects $cm^{-2}$ in some embodiments. In some cases, a density of defects at a top surface of the epitaxial layer 120 may be less than $10^9$ defects $cm^{-2}$ in some embodiments, less than $10^6$ defects $cm^{-2}$ in some embodiments, less than $10^4$ defects $cm^{-2}$ in some embodiments, less than $10^2$ defects $cm^{-2}$ in some embodiments, and yet less than 10 defects $cm^{-2}$ in some embodiments.

Figure 2I:
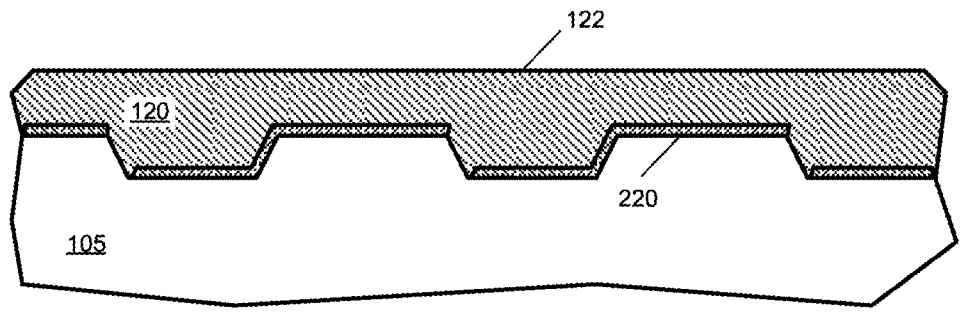
FIG. 2I depicts a planarized epitaxial layer of semipolar GaN on a patterned sapphire substrate, according to some embodiments.

According to some embodiments, the epitaxial layer 120 may be planarized, as depicted in FIG. 2I. For example, chemical-mechanical polishing (CMP) may be used to planarize the process surface 122 of the epitaxial semiconductor 120 layer. The planarization may remove between approximately 20% and approximately 60% of the epitaxially-grown layer 120. In some cases, the planarization may remove between 20% and 60% of the epitaxially-grown layer. For example, an epitaxial semiconductor layer 120 may be grown to a thickness of approximately 10 microns, and a CMP process may remove between approximately 2 microns and approximately 6 microns. Less material may be grown and removed in some applications.

In some embodiments, a substrate with an epitaxial layer formed on patterned sapphire may be bowed prior to CMP. The bowing of the substrate may result from mismatched thermal coefficients of expansion between the sapphire and III-nitride material. A CMP process on a bowed substrate may lead to differences in the amount of material removed from the substrate due to non-uniform pressures across the substrate.

In some cases, differential pressure may be applied across the substrate by the CMP pad to reduce non-uniform material removal. In some embodiments, strain-balancing measures on the substrate may be implemented (e.g., deposition of material on a back side of the substrate to compensate strain imparted by the GaN layer).

Although thickness variations of an epilayer resulting from CMP may be undesirable in a device layer (e.g., potentially causing non-uniform device performance across a substrate), it is unclear as to what precision is needed to obtain reasonably consistent device characteristics across the substrate. It is not expected that defect density will change significantly with thickness differences attributed to wafer bow and uneven material removal during CMP. Possibilities for improvement of thickness uniformity, such as optimization of the CMP process and methods for strain balancing to remove wafer bow may be applied, in some embodiments, if non-uniform device performance occurs.

Another factor to consider when employing CMP planarization is potential subsurface damage arising from the polishing process. However, experimental evidence from literature indicates the depth of polishing damage in GaN for typical CMP processes is in a range from below about 1.5 μm to about 2.6 μm. Thus, initial epilayer thicknesses of about 10 microns and CMP removal of between approximately 2 microns and approximately 6 microns may provide suitable material quality at a process surface of the GaN, according to some embodiments.

Figure 2J:
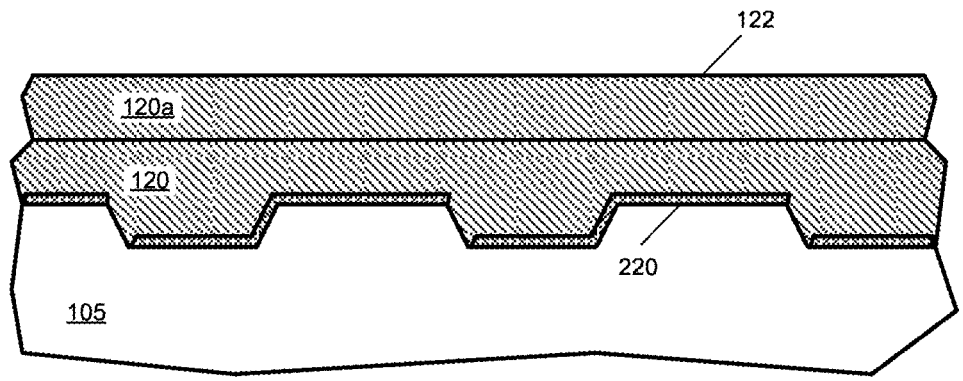
FIG. 2J depicts regrowth of semipolar GaN on a patterned sapphire substrate, according to some embodiments.

Regrowth of semipolar III-nitride material may be carried out on the planarized surface 122 to form a regrowth layer 120a, as depicted in FIG. 2J. According to some embodiments, regrowth conditions may comprise growth temperatures between approximately 980° C. and approximately 1070° C., pressures between approximately 100 mbar and approximately 300 mbar, $NH_3$ flow rates between approximately 0.5 slm and approximately 4 slm, TMGa flow rates between approximately 30 sccm and approximately 50 sccm, and III-nitride growth rates between approximately 1 μm/hr and approximately 2.2 μm/hr. In some cases, regrowth conditions may comprise growth temperatures between 980° C. and 1070° C., pressures between 100 mbar and 300 mbar, $NH_3$ flow rates between 0.5 slm and 4 slm, TMGa flow rates between 30 sccm and 50 sccm, and III-nitride growth rates between 1 μm/hr and 2.2 μm/hr. In some implementations, triethylgallium (TEG) gas may be used at the same range of flow rates. A thickness of the regrowth layer may be between approximately 200 nm and approximately 10 microns, although thinner regrowth layers may be used in some embodiments. In some cases, a thickness of the regrowth layer may be between 200 nm and 10 microns.

In various embodiments, regrowth may be carried out using a nitrogen (e.g., $N_2$) carrier gas instead of a hydrogen (e.g., $H_2$) carrier gas. A carrier gas (e.g., $N_2$) may be a gas that is included with reactant or precursor gases (e.g., $NH_3$ and TMGa) that is not intended to contribute a species to growth of the semiconductor. The flow rate of $N_2$ carrier gas may be between approximately 3 slm and approximately 10 slm. In some instances, the flow rate of $N_2$ carrier gas may be between 3 slm and 10 slm. The inventors have discovered and appreciated that use of nitrogen carrier gas during regrowth provides a microfabrication-grade, planar, process surface for the semipolar GaN epilayer, whereas a hydrogen carrier gas results in a multi-faceted process surface having considerable roughness. When a nitrogen carrier gas is used, a single planar surface with roughness less than 3 nm root-mean-square over a 15 μm×15 μm area is obtained. According to some embodiments, regrowth may be carried out at approximately 980° C., 200 mbar, 4 slm $NH_3$ flow, and 40 sccm TMGa flow.

Although epitaxial growth of semipolar GaN has been described, semipolar orientations of other III-nitride materials (e.g., (Al, In, Ga)N) may be grown according to some embodiments. The structures and methods may also be used to form various semipolar III-nitride alloys (e.g., AlGaN, InGaN, InAlGaN). In some implementations, a portion or all of an epitaxially-grown layer may be doped to have n-type or p-type conductivity, so that integrated circuit devices such as transistors, diodes, thyristors, LEDs and laser diodes can be fabricated in the epitaxial layer. Doping may be done during epitaxial growth in some cases, and/or after growth (e.g., using ion implantation into the epilayer). Microfabrication-grade substrates may be mass-produced using some standard techniques such as MOCVD, etching, chemical-mechanical polishing, etc., and the substrates may be scaled to different sizes (e.g., larger than 2-inch diameter). The processes described above can avoid expenses associated with growing bulk GaN crystals and producing wafers from such boules. The structures and methods described above may enable the fabrication of semipolar GaN epilayers on relatively inexpensive sapphire substrates, which are commercially mature and widely available.

Although the structures and methods described above primarily relate to forming semi-gallium-polar (20$\underline{2}$1) GaN epitaxial layers, the methods may be used to form other semipolar facet orientations. For example, nonpolar (11$\underline{2}$0), and (10$\underline{1}$0), as well as semipolar (10$\underline{1}$1), (11$\underline{2}$2), may be grown using patterned sapphire substrates that are selectively cut with different crystallographic orientations. Virtually any GaN orientation in an epitaxial layer may be possible by using a correctly sliced sapphire substrate and etching the sapphire to expose c-plane crystal-growth surfaces.

EXAMPLES

1. Formation of Planar, Semipolar GaN Epilayers

Epitaxial growth, planarization, and regrowth of semipolar (20$\underline{2}$1) GaN was carried out on patterned sapphire substrates following the methods described above. In these example processes, the sapphire substrates had a diameter of 2 inches, though other diameters may be used following the same processes.

A sapphire substrate having a (22$\underline{4}$3) facet parallel to its surface was patterned following the steps described in connection with FIGS. 2A-2B and comprised crystal-growth surfaces 115 spaced approximately 6 μm apart, and the etch depth D of trenches in the sapphire substrate is approximately 0.5 μm. The crystal-growth surfaces were oriented at approximately 75° from the process surface of the substrate.

Other surfaces on the PSS substrate were masked with a PECVD oxide, as described above in connection with FIGS. 2C-2F.

After cleaning, the PSS was loaded into a MOCVD reactor for III-nitride growth. A thermal cleaning and desorption step was executed under $H_2$ ambient at 1100° C. Subsequently, a low-temperature AN buffer layer (approximately 20 nm thick) was formed at approximately 500° C., 200 mbar pressure, $NH_3$ flow rate of approximately 1 slm, and a flow rate of trimethylaluminum (TMA) of approximately 40 sccm. The deposition rate of the buffer layer was approximately 0.15 nm/sec. After growth, the buffer layer was annealed at approximately 1030° C. for approximately 4 minutes in a mixture of $NH_3$ and $H_2$. The $NH_3$ flow rate is between approximately 0.5 slm to approximately 4 slm, and the $H_2$ flow rate is between approximately 4 slm to approximately 8 slm.

Subsequently, semipolar (20$\bar{2}$1) GaN was grown from the buffer layer at the crystal-growth surfaces. The GaN growth conditions were approximately 1030° C., approximately 200 mbar, approximately 1 slm $NH_3$ flow rate, and approximately 40 sccm flow rate of trimethylgallium (TMGa). Growth was performed at a growth rate of approximately 3.6 μm/hr, and a V/III ratio of approximately 500. The initial growth thickness of the semipolar GaN epilayer 120 was approximately 10.5 microns.

Figure 3A:
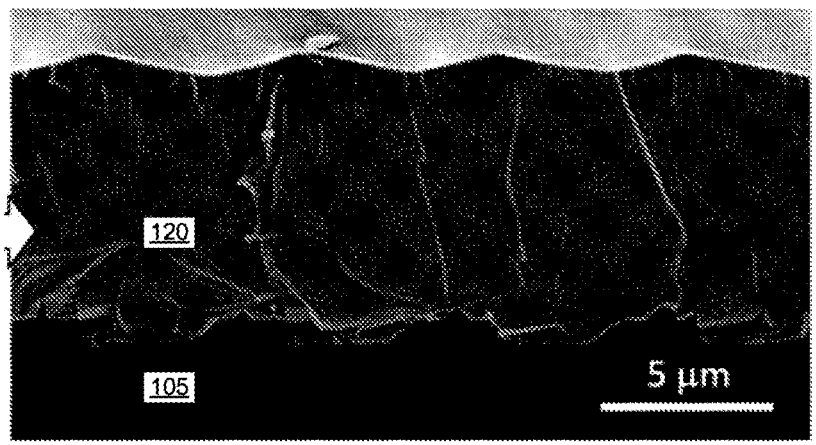
FIG. 3A is a scanning-electron micrograph showing, in elevation view, coalesced semi-gallium-polar GaN formed on a patterned sapphire substrate, according to some embodiments.

FIG. 3A is a scanning electron micrograph that shows, in elevation view, a coalesced semipolar GaN layer grown from the masked and patterned sapphire substrate.

The structure corresponds to that depicted in FIG. 2H. The SEM image shows a portion of a semipolar GaN epitaxial layer 120 grown over the patterned sapphire substrate 105. The material exhibits single (20$\bar{2}$1) GaN orientation parallel to the sapphire (22$\bar{4}$3) facet, as designed. The SEM image shows a corrugated process surface composed of (10$\bar{1}$1) and (10$\bar{1}$0) facets.

Figure 3B:
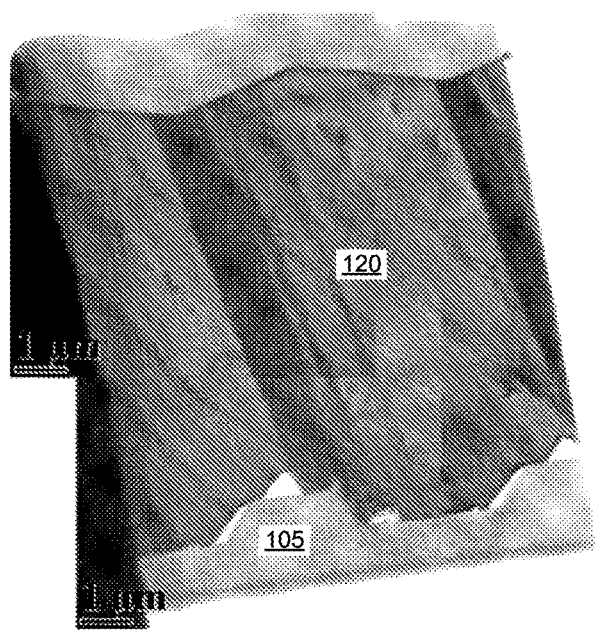
FIG. 3B is a transmission-electron microscope (TEM) image of a region of semipolar GaN formed on a patterned sapphire substrate.

Defect structure of the semipolar GaN epilayer was investigated using a transmission electron microscope (TEM). A cross-section TEM image is shown in FIG. 3B, with zone axis of [11$\bar{2}$0] and g=10$\bar{1}$0. The image reveals dislocation contrast of a-type, and also reveals partial dislocations associated with basal plane stacking faults. TEM images (not shown) were also taken with zone axis of [11$\bar{2}$0] and g=0002, which reveal dislocation contrast of c-type. In the g=10$\bar{1}$0 image, the straight line contrast originating from the growth sidewall at an angle of approximately 15° from vertical are confined to the basal plane, and are attributed to the presence of I1-type stacking faults. The rest of the crystal shows a lower density of defects, with short threading segments appearing, indicating dislocations propagating in the out-of-plane direction. In the g=0002 diffraction images (not shown), the contrast in the faulted region disappears (consistent with the invisibility criterion of the partial dislocations associated with I1-type stacking faults), and increased density of dislocation contrast appears, particularly at the coalescence front.

The region in which basal plane stacking faults are formed corresponds to the region from the initial growth front, and extends towards the nitrogen-polar direction of growth. These stacking faults are undesirable in active layers. The formation of stacking faults in this region is consistent with earlier reports on vicinal c-sapphire substrates. If the etched sidewalls of the patterned sapphire substrate do not form an exact c-sapphire sidewall (e.g., up to approximately 10° off-axis), staking faults may arise. Also, as has been seen in epitaxial lateral overgrowth of semipolar and nonpolar GaN, nitrogen-polar direction growth over dielectric masks exhibits faulting with a much higher density than the gallium-polar direction.

Figure 3C:
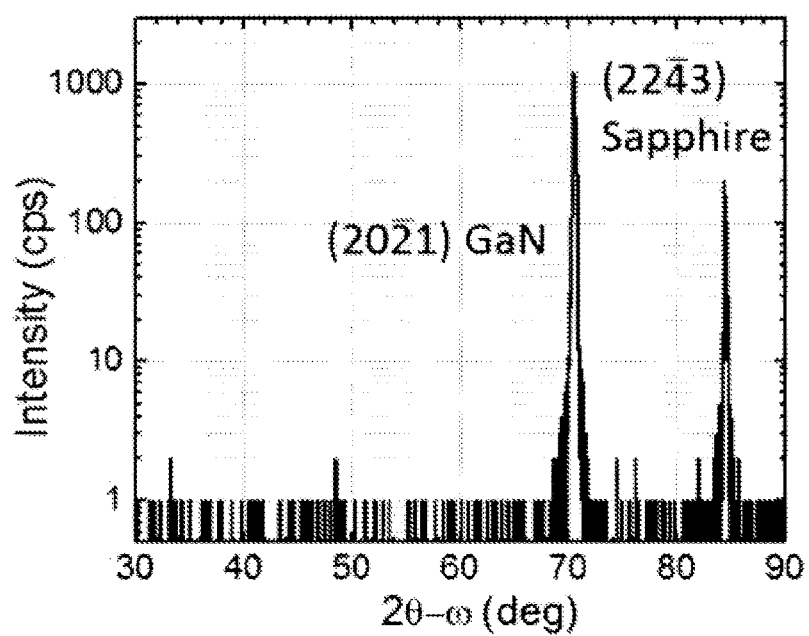
FIG. 3C is an x-ray diffraction(XRD) scan showing single orientation GaN with (20$\underline{2}$1) facet parallel to the sapphire substrate plane.

An x-ray diffraction scan (2θ-ω) was taken of the epitaxial semipolar GaN, and the results are shown in FIG. 3C. The scan shows two distinctive peaks. The first peak at approximately 70.2° indicates the presence of (20$\bar{2}$1) GaN oriented parallel to the process plane of the substrate. The second peak at approximately 84.4° Corresponds to the (22$\bar{4}$3) sapphire facet. These results confirm that semi-gallium-polar GaN having a (20$\bar{2}$1) orientation can be formed over patterned sapphire substrates.

Figure 3D:
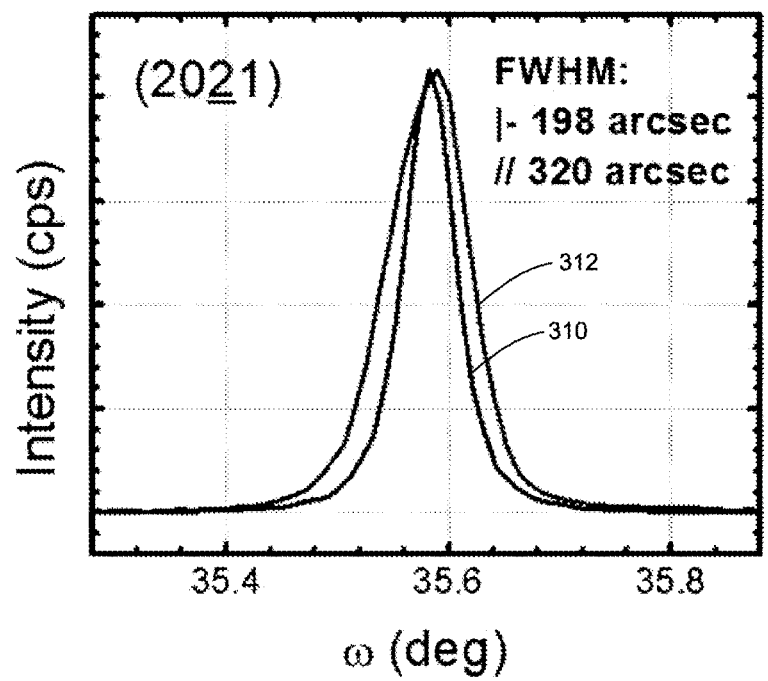
FIG. 3D shows high-resolution x-ray diffraction rocking curves taken on-axis (20$\underline{2}$1) for the rocking axis parallel (curve 312) and perpendicular (curve 310) to patterned trenches in the sapphire substrate.

The material quality of the semipolar GaN template was also characterized by XRD rocking curve analysis, with open detector configuration. Results of these measurements are shown in FIG. 3D. The measured on-axis (20$\bar{2}$1) rocking curves widths range between 198 arc seconds and 320 arc seconds full-width half-maximum (FWHM) values, with the rocking axis perpendicular to or parallel to the patterned stripes, respectively. The anisotropy of the rocking curve widths, due to tilting of the crystal along the stripes and coalescence related defects, is minimal. A more complete diffraction analysis, including all low-index off-axis diffractions, including (000 2n), (n0$\bar{n}$0), (11$\bar{2}$ 2n) for n=1 to 3, results in all measured linewidths being less than about 800 arcseconds FWHM. These results indicate a microstructural quality can be achieved with the above-described growth methods that is on par with commercial-grade polar (0001) GaN on sapphire, and also indicate a much-improved quality over nonpolar and semipolar GaN grown by conventional methods on planar sapphire substrates.

Figure 3E:
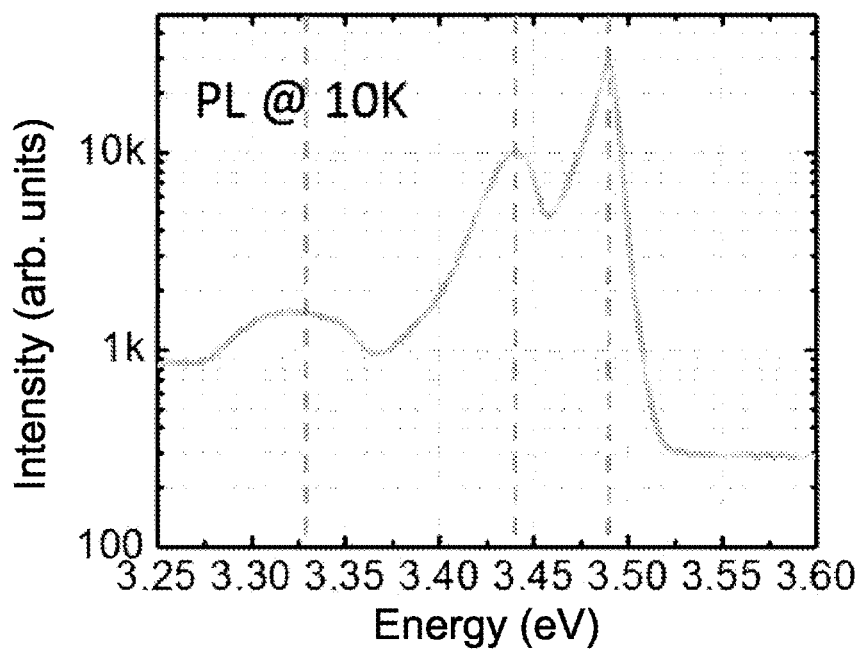
FIG. 3E shows a low-temperature photoluminescence (LT-PL) spectrum of epitaxially-grown semipolar GaN, with the peak positions marked and assigned to GaN band-edge emission (3.49 eV), excitons bound to stacking faults (3.44 eV), and impurities bound to partial dislocations (3.33 eV)

Defect structure was also investigated with low-temperature photoluminescence (LT-PL). A LT-PL spectrum measured at 10 K (FIG. 3E) shows a BSF-related emission peak at approximately 3.44 eV in addition to a much stronger band-edge emission at approximately 3.49 eV. Also visible is a low intensity peak at approximately 3.32 eV, which may indicate a low density of prismatic stacking faults. However, the high relative intensity of band-edge to BSF-related emission and a narrow linewidth of the GaN band-edge emission (measured to be approximately 14 meV) indicate high microstructural quality compared to conventionally-grown semipolar or nonpolar GaN.

The surface of the corrugated epilayer was planarized using a commercial chemical-mechanical polishing process available from Novasic of Saint-Baldoph, France. The 2" (20$\bar{2}$1) GaN-on-sapphire substrate was polished to give a specularly reflective surface across the entire GaN epilayer. Reflectance was used to measure the GaN material thickness remaining, and indicated that a range of 3 to 5 μm of GaN material was removed across the substrate from the original 10.5 μm GaN epilayer. Differences in amount of material removed amounted to approximately 20% thickness variation of the remaining planarized GaN layer. Although thickness variations could potentially result in an offcut from the (20$\bar{2}$1) surface, it amounted to less than $5 \times 10^{-3}$ degrees for the present case. Accordingly, the (20$\bar{2}$1) facet remained approximately parallel to the process surface of the substrate. The surface of the planarized GaN substrate after CMP process was characterized by atomic-force microscope (AFM) measurements. A root-mean-square (RMS) roughness of less than approximately 0.5 nm was measured for areas of 15 μm×15 μm in size, and is indistinguishable both in RMS roughness and morphology between the center and edge of the substrate. The AFM images also showed straight surface variations having a periodicity 6 μm and a height less than 1 nm, which corresponds to the underlying pattern of the patterned sapphire substrate. It was unclear why the pattern persisted after CMP.

Regrowth of the epilayer was then carried out. A first set of regrowth conditions comprised using a hydrogen carrier gas. Other regrowth parameters were varied as follows: growth rates between approximately 1 µm/hr and approximately 2 µm/hr, temperatures between approximately 980° C. and approximately 1070° C., pressures between approximately 100 mbar and approximately 300 mbar, NH$_3$ flows between approximately 0.5 slm and approximately 4 slm. The flow rate for TMGa was approximately 40 sccm. Even though a (20$\bar{2}$1) oriented semipolar GaN layer was achieved after regrowth, the regrowth surface became faceted, as shown in FIGS. 4A-4C. Surprisingly, even after the planarization by CMP, regrowth on the substrate began to reproduce the (10$\bar{1}$0) and (10$\bar{1}$1) facets of the original substrates, with the same periodicity of 6 µm as the underlying patterned sapphire substrate. In between these large reappearing facets, the (20$\bar{2}$1) surface shows a finer scale microfaceting. FIG. 4A is a plan-view SEM micrograph showing a microfaceted (20$\bar{2}$1) surface along with (10$\bar{1}$1) and (10$\bar{1}$0) facets. Sloping of the (10$\bar{1}$1) and (10$\bar{1}$0) facets is seen more clearly in the larger-area AFM image of FIG. 4B. FIG. 4C shows details of microfaceting on the (20$\bar{2}$1) surface of the regrown GaN. The faceted surface morphology is consistent with growth on bulk (20$\bar{2}$1) substrates, and reflects the stability of the (10$\bar{1}$1) and (10$\bar{1}$0) facets over the (20$\bar{2}$1) surface.

Figure 5A:
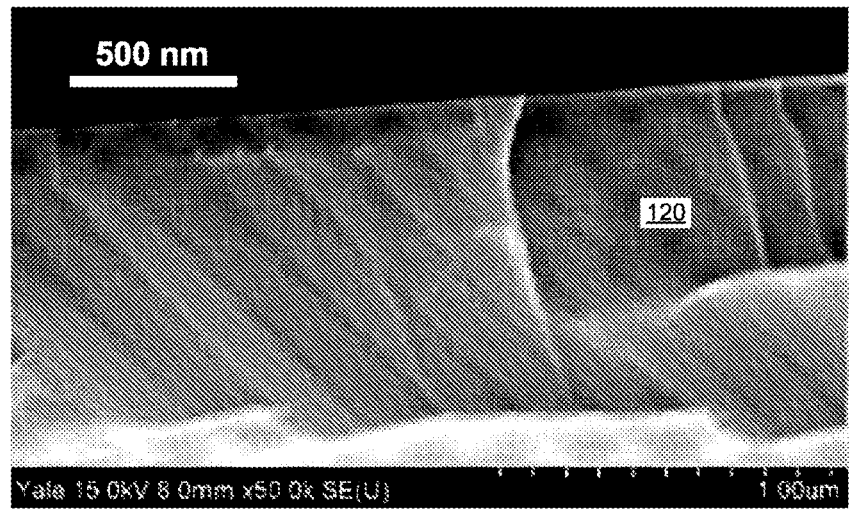
FIG. 5A is an SEM image showing, in elevation view, planar regrowth of semipolar GaN formed on a patterned sapphire substrate, according to some embodiments.
Figure 5B:
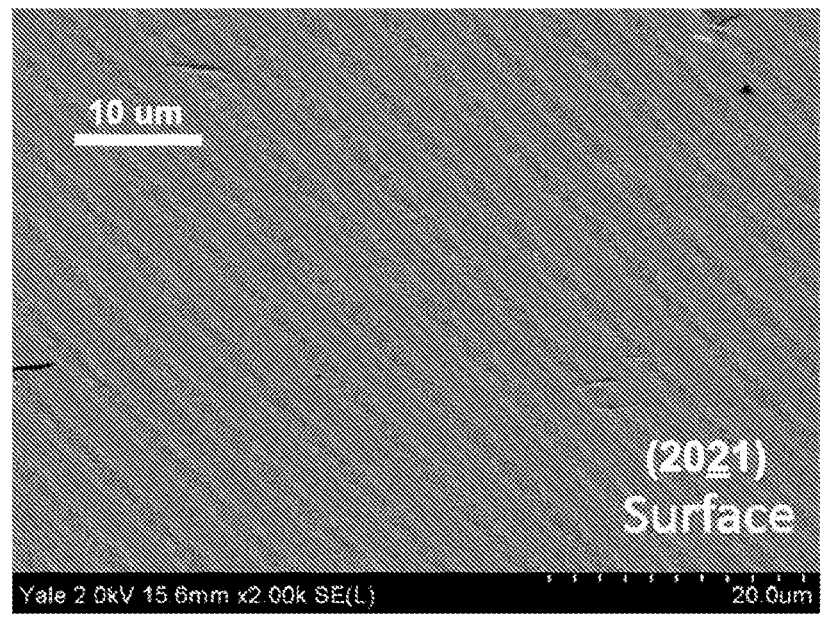
FIG. 5B is an SEM image showing, in plan view, planar regrowth of semipolar GaN formed on a patterned sapphire substrate, according to some embodiments.

In a second regrowth run, a nitrogen (N$_2$) carrier gas was used instead of the hydrogen carrier gas. The other regrowth parameters were varied as for the case when H$_2$ was used as the carrier gas. Regrowth under N$_2$ carrier gas shows a completely different surface morphology for the regrown layer, as shown in FIGS. 5A-5B. For these regrowth conditions, the (20$\bar{2}$1)-oriented process surface of GaN was planar, and did not show faceting. FIG. 5A is an elevation-view SEM image of the GaN epilayer 120, and FIG. 5B is a plan-view SEM image of the (20$\bar{2}$1) surface of the epilayer. Approximately 500 nm of GaN was regrown on the GaN after CMP. Neither the SEM images nor AFM measurements show faceting of the (20$\bar{2}$1) surface.

Variations in regrowth parameters indicated several trends in forming non-faceted (20$\bar{2}$1) GaN by epitaxial regrowth. A reduction in temperature and an increase in growth rate led to smoother and more planar (20$\bar{2}$1) GaN. A reduction in pressure and increase in V/III ratio led to smoother and more planar (20$\bar{2}$1) GaN. AFM measurements showed a surface smoothness less than 3 nm RMS for the regrown (20$\bar{2}$1) GaN under N$_2$ carrier gas conditions. These results demonstrate that microfabrication-grade, planar (20$\bar{2}$1) GaN layers may be grown on low-cost patterned sapphire substrates.

These results also overcome difficulties and complexities associated with conventional methods of forming millimeter-thick layers of GaN on substrates using hydride vapor phase epitaxy (HVPE) growth. Such techniques can lead to high intrinsic stresses, cracking, and inclusions in the GaN layer. Additionally, these processes can be expensive due to the cost of high purity precursor material and long growth times.

2. Fabrication of Multiple Quantum Wells in Semipolar GaN

Having established regrowth processes on semipolar GaN to maintain a planar (20$\bar{2}$1) surface, the growth of InGaN active layers was carried out. As an example, InGaN/GaN multiple quantum well (MQW) structures were grown under N$_2$ carrier gas, under standard c-plane MQW growth conditions. Well/barrier widths were selected to be approximately 3 nm/8 nm, with QW growth temperatures between 740° C. and 770° C., and growth rate of approximately 0.1 µm/hr. Barrier growth temperatures were 70° C. higher. The MQW structures were formed during regrowth of a GaN layer.

Figure 6A:
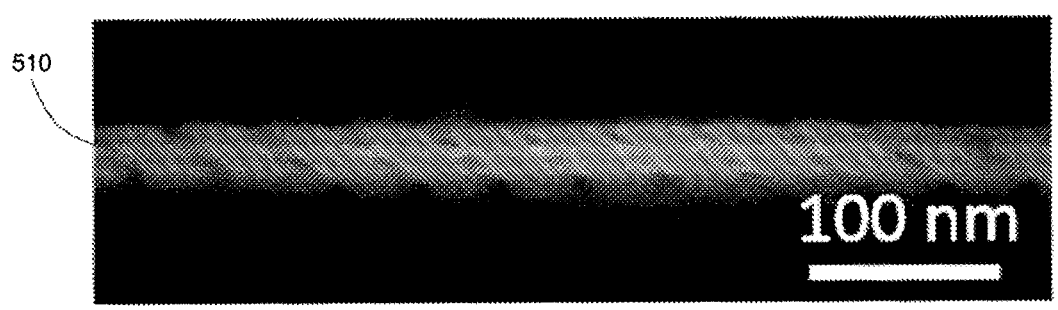
FIG. 6A is an SEM image showing, in elevation view, multiple quantum wells (MQWs) formed on (20$\underline{2}$1) GaN; according to some embodiments.

An elevation-view SEM image of a three-pair MQW structure is shown in FIG. 6A. The image shows well-defined quantum wells, which are planar within the imaging resolution over the entire region. Other quantum well structures having more layer pairs were also formed.

Figure 6B:
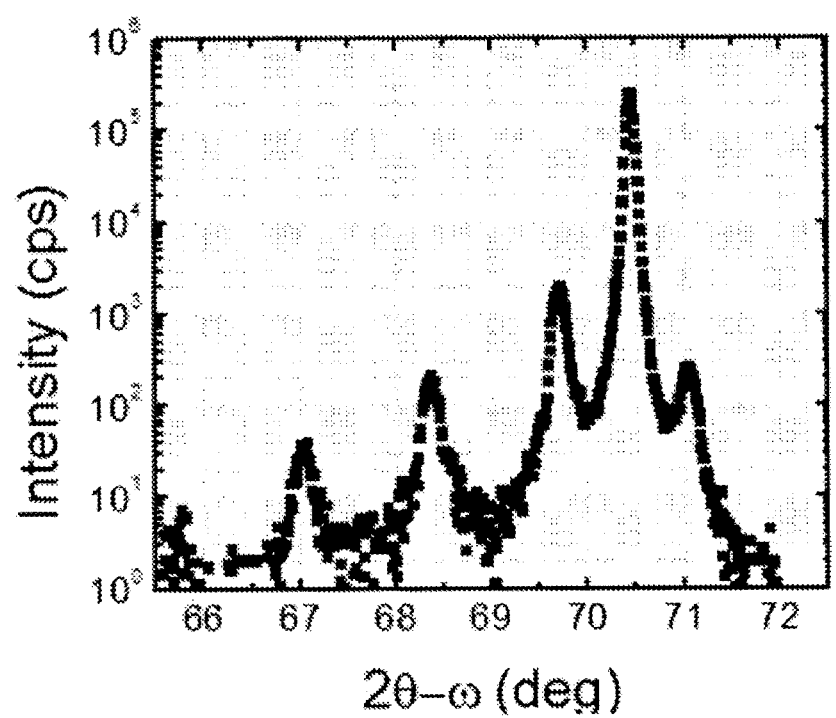
FIG. 6B is an XRD 2θ-ω scan of the MQWs and shows strong and distinct higher order satellite peaks, indicating uniformity and sharp, planar interfaces, according to some embodiments.
Figure 6C:
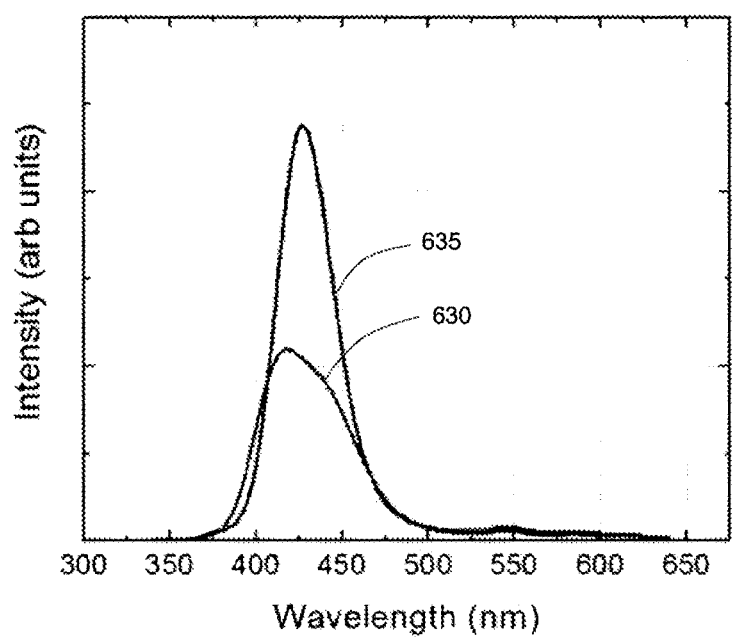
FIG. 6C is a plot of photoluminescence spectra for a 10-pair InGaN/GaN MQW structure formed on an epitaxial layer of semipolar GaN without planarization (curve 630) and with planarization (curve 635).

An XRD 2θ-ω scan of a 10-pair MQW structure is shown in FIG. 6B. The presence of clear, high-order superlattice peaks indicates abrupt QW interfaces and planar wells over large length scales. Photoluminescence spectra were measured from two, 10-pair MQW structures, and are shown in FIG. 6C. The first MQW was formed on a faceted semipolar (20$\bar{2}$1) GaN epilayer that was grown without the planaraization step (e.g., CMP and regrowth was not done). A spectrum (curve 630) for this MQW structure shows a blue-shifted peak at approximately 420 nm with a FWHM bandwidth of approximately 62 nm.

The second MQW structure was formed on planar, semipolar (20$\bar{2}$1) GaN epilayer that was regrown on a planarized semipolar GaN layer. A spectrum (curve 635) for this MQW structure shows a blue-shifted peak at approximately 420 nm with a FWHM bandwidth of approximately 39 nm, indicating an improved performance for the planarized substrate. In both cases, the pholtoluminescence peak is blue-shifted over 40 nm from c-plane GaN MQWs grown under the same growth conditions. The blue shift may be attributed to the reduced polarization fields, decrease of indium incorporation, or variation of the QW thickness. On-axis and off-axis reciprocal space maps of the QW structure shows coherent growth, with well-defined InGaN QW peaks. These results indicate the suitability of regrown GaN on patterned sapphire substrates for semipolar GaN devices.

CONCLUSION

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

Selective etching, as used herein, comprises subjecting a substrate to an etchant that preferentially etches at least one material at a faster rate than a second material. In some cases, the second material may be formed as a hard mask (e.g., an inorganic material such as an oxide, nitride, metal, or the like) or soft mask (e.g., a photoresist or polymer). In some embodiments, the second material may be part of a device structure that has different material characteristics than the first material (e.g., doping density, material composition, or crystal structure). A selective etch may be a dry etch or wet etch.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Although the drawings typically depict a small portion of an epitaxially-grown GaN layers, it will be appreciated that a large area or entire substrate may be covered with such an epitaxially-grown layer. Further, integrated-circuit devices (e.g., transistors, diodes, thyristors, light-emitting diodes, laser diodes, photodiodes and the like) may be fabricated using the epitaxially-grown material. In some embodiments, the integrated-circuit devices may be used in consumer electronic devices such as smart phones, tablets, PDA's, computers, televisions, sensors, lighting, displays, as well as application-specific integrated circuits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for forming an epitaxial layer of semipolar gallium-nitride on a substrate, the method comprising
   growing semipolar gallium-nitride adjacent to crystal-growth surfaces of a patterned sapphire substrate, wherein the crystal-growth surfaces comprise a first portion of a plurality of surfaces of different orientations formed on the patterned sapphire substrate that are not masked by a masking material that masks a remaining second portion of the plurality of surfaces and wherein the crystal-growth surfaces have one select orientation of the different orientations.

2. The method of claim 1, further comprising forming a low-temperature aluminum-nitride or a low-temperature gallium-nitride buffer layer at the crystal-growth surfaces.

3. The method of claim 2, wherein either of the low-temperature buffer layers are formed below a temperature of approximately 600° C.

4. The method of claim 1, further comprising:
   planarizing the grown semipolar gallium-nitride; and
   regrowing the semipolar gallium-nitride using a nitrogen carrier gas.

5. The method of claim 4, wherein regrowing the semipolar gallium-nitride comprises regrowth conditions that do not include a hydrogen carrier gas.

6. The method of claim 4, wherein the nitrogen carrier gas is $N_2$.

7. The method of claim 4, wherein regrowing the semipolar gallium-nitride comprises growing the semipolar gallium-nitride using metal-organic chemical vapor deposition.

8. The method of claim 7, wherein a temperature during regrowth is between approximately 980° C. and approximately 1070° C.

9. The method of claim 7, wherein a pressure during regrowth is between approximately 100 mbar and approximately 300 mbar.

10. The method of claim 7, wherein a flow rate of $NH_3$ gas during regrowth is between approximately 0.5 slm and approximately 4 slm.

11. The method of claim 7, wherein a flow rate of trimethylgallium or triethylgallium during regrowth is between approximately 30 sccm and approximately 50 sccm.

12. The method of claim 7, wherein a growth rate during regrowth is between 1 μm/hr and approximately 2 μm/hr.

13. The method of claim 4, wherein growing semipolar gallium-nitride and regrowing semipolar gallium-nitride comprise growing the gallium-nitride with a (2021) facet approximately parallel to a process surface of the substrate.

14. The method of claim 4, wherein planarizing the grown semipolar gallium-nitride comprises planarization by chemical-mechanical polishing.

15. The method of claim 4, further comprising, prior to growing semipolar gallium-nitride, forming the masking layer to cover the plurality of surfaces of the patterned sapphire substrate.

16. The method of claim 15, wherein forming the masking layer comprises depositing a material conformally by a vapor deposition process.

17. The method of claim 16, further comprising removing the conformally deposited material from the crystal-growth surfaces.

18. A substrate comprising:
   a patterned sapphire substrate having a plurality of surfaces at different orientations and a masking layer formed over all of the plurality of surfaces except crystal-growth surfaces that are a portion of the plurality of surfaces having one select orientation of the different orientations; and
   a semipolar gallium-nitride epitaxial layer formed over the patterned sapphire substrate.

19. The substrate of claim 18, wherein the patterned sapphire substrate has a (2243) facet approximately parallel to a process surface of the substrate and a c-plane facet approximately parallel to the crystal-growth surfaces.

20. The substrate of claim 18, wherein the patterned sapphire substrate comprises an array of trenches with the crystal-growth surfaces forming inclined walls of the trenches.

21. The substrate of claim 20, wherein a spacing of the trenches is between approximately 0.25 microns and approximately 10 microns, and a depth of the trenches is between approximately 50 nanometers and approximately 2 microns.

22. The substrate of claim 20, wherein the epitaxial gallium-nitride layer coalesces above the trenches to form a continuous and planar semiconductor layer across the substrate.

23. The substrate of claim 22, wherein a roughness of a surface of the planer semiconductor layer measured over a 15 μm×15 μm area is less than 5 nm root-mean-square.

24. The substrate of claim 18, further comprising a buffer layer between the crystal-growth surfaces and the epitaxial gallium-nitride.

25. The substrate of claim 24, wherein the buffer layer comprises aluminum-nitride.

26. The substrate of claim 22, wherein the planar semipolar gallium-nitride epitaxial layer has a single and continuous planar surface across the substrate that is approximately parallel to a (2021) facet of the semipolar gallium-nitride.

* * * * *